US006225232B1

United States Patent
Lee

(10) Patent No.: US 6,225,232 B1
(45) Date of Patent: May 1, 2001

(54) SEMICONDUCTOR PROCESSING METHODS, AND METHODS OF FORMING CAPACITOR CONSTRUCTIONS

(75) Inventor: Whonchee Lee, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/669,093

(22) Filed: Sep. 25, 2000

Related U.S. Application Data

(63) Continuation of application No. 09/320,381, filed on May 26, 1999, now Pat. No. 6,140,245.

(51) Int. Cl.$^7$ .................................................. H01L 21/00
(52) U.S. Cl. .............................. 438/705; 216/87; 216/99; 438/745; 438/753
(58) Field of Search ................................. 438/705, 714, 438/745, 753, 756; 216/62, 87, 99

(56) References Cited

U.S. PATENT DOCUMENTS

| | | | |
|---|---|---|---|
| 4,090,915 | * 5/1978 | Keller | 438/705 X |
| 5,358,908 | * 10/1994 | Reinberg et al. | 438/705 X |
| 5,639,689 | 6/1997 | Woo . | |
| 5,817,580 | 10/1998 | Violette . | |
| 5,869,399 | * 2/1999 | Tu et al. | 438/705 |
| 5,872,045 | * 2/1999 | Lou et al. | 438/705 X |
| 5,946,595 | 8/1999 | Doan et al. . | |
| 6,090,722 | * 7/2000 | Armacost et al. | 438/705 X |

* cited by examiner

Primary Examiner—William Powell
(74) Attorney, Agent, or Firm—Wells, St. John, Roberts, Gregory & Matkin, P.S.

(57) ABSTRACT

In one aspect, the invention encompasses a semiconductor processing method. Two silicon-comprising masses are provided. A first of the two masses comprises a higher dopant concentration than a second of the two masses. The two masses are exposed to common conditions which etch the second mass faster than the first mass. In another aspect, the invention encompasses another embodiment semiconductor processing method. A substrate is provided. The substrate has at least one doped polysilicon mass formed thereover, and has regions not proximate the at least one doped polysilicon mass. Roughened polysilicon is formed along the at least one doped polysilicon mass and over said regions of the substrate. A dopant concentration in the roughened polysilicon is increased along the at least one doped polysilicon mass relative to any dopant concentration in the roughened polysilicon over said regions of the substrate. After the dopant concentration is increased, the roughened polysilicon along the at least one doped polysilicon mass and the roughened polysilicon over said regions of the substrate are exposed to common conditions. The common conditions remove the roughened polysilicon from over said regions of the substrate and leave the roughened polysilicon along the doped polysilicon mass.

34 Claims, 4 Drawing Sheets

SEMICONDUCTOR PROCESSING METHODS, AND METHODS OF FORMING CAPACITOR CONSTRUCTIONS

RELATED PATENT DATA

This patent is a continuation application of U.S. patent application Ser. No. 09/320,381 which was filed on May 26, 1999, now U.S. Pat. No. 6,140,245.

TECHNICAL FIELD

The invention pertains to semiconductor processing methods, including, for example, methods of forming capacitor constructions. In particular aspects, the invention pertains to methods of selectively etching a less-doped silicon-comprising mass faster than a higher-doped silicon-comprising mass, and to semiconductor fabrication processes incorporating such methods.

BACKGROUND OF THE INVENTION

Semiconductor fabrication processes frequently involve patterning of electrical devices and interconnections from semiconductive materials. A method of accomplishing such patterning is to treat a semiconductive material such that one portion is selectively etchable relative to another portion. For instance, silicon-comprising semiconductive materials can be treated with a dopant to render certain portions selectively etchable relative to other portions. Specifically, if portions of a silicon-comprising material are doped with phosphorus, such portions will be selectively etchable relative to other portions that are not doped with phosphorus under etching conditions utilizing a base, such as, for example, KOH, NaOH, $NH_4OH$, and tetramethyl ammonium hydroxide (TMAH).

Although the above-discussed methodology enables patterning of a silicon-comprising material, the processing can be difficult to incorporate into applications in which it is a doped silicon-comprising material that is ultimately desired. Specifically, since the above-discussed methodology selectively removes doped silicon relative to undoped silicon, patterning incorporating such methodology ultimately forms an undoped silicon-comprising material. In many semiconductor processing applications, it is ultimately desired to form a doped silicon-comprising material. For instance, in applications in which it is desired to have the silicon-comprising material be conductive, it is ultimately desired that the silicon-comprising material be doped. In such applications, the above-discussed methodology for selectively removing a doped silicon-comprising material relative to an undoped silicon-comprising material is exactly backwards of what would be desired.

SUMMARY OF THE INVENTION

In one aspect, the invention encompasses a semiconductor processing method. Two silicon-comprising masses are provided. A first of the two masses comprises a higher dopant concentration than a second of the two masses. The two masses are exposed to common conditions which etch the second mass faster than the first mass.

In another aspect, the invention encompasses another embodiment semiconductor processing method. A substrate is provided. The substrate has at least one doped polysilicon mass formed thereover, and has regions spaced from the at least one doped polysilicon mass. Roughened polysilicon is formed along the at least one doped polysilicon mass and over said regions of the substrate. A dopant concentration in the roughened polysilicon is increased along the at least one doped polysilicon mass relative to any dopant concentration in the roughened polysilicon over said regions of the substrate. After the dopant concentration is increased, the roughened polysilicon along the at least one doped polysilicon mass and the roughened polysilicon over said regions of the substrate are exposed to common conditions. The common conditions remove the roughened polysilicon from over said regions of the substrate while leaving the roughened polysilicon along the doped polysilicon mass.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

An exemplary application of a method of the present invention is described with reference to FIGS. 1–5. In the exemplary application, the method is utilized for formation of capacitors in a DRAM cell. However, it is to be understood that methods of the present invention are to be limited only by the claims that follow, and not to the particular exemplary application described in FIGS. 1–5.

Figure 1:
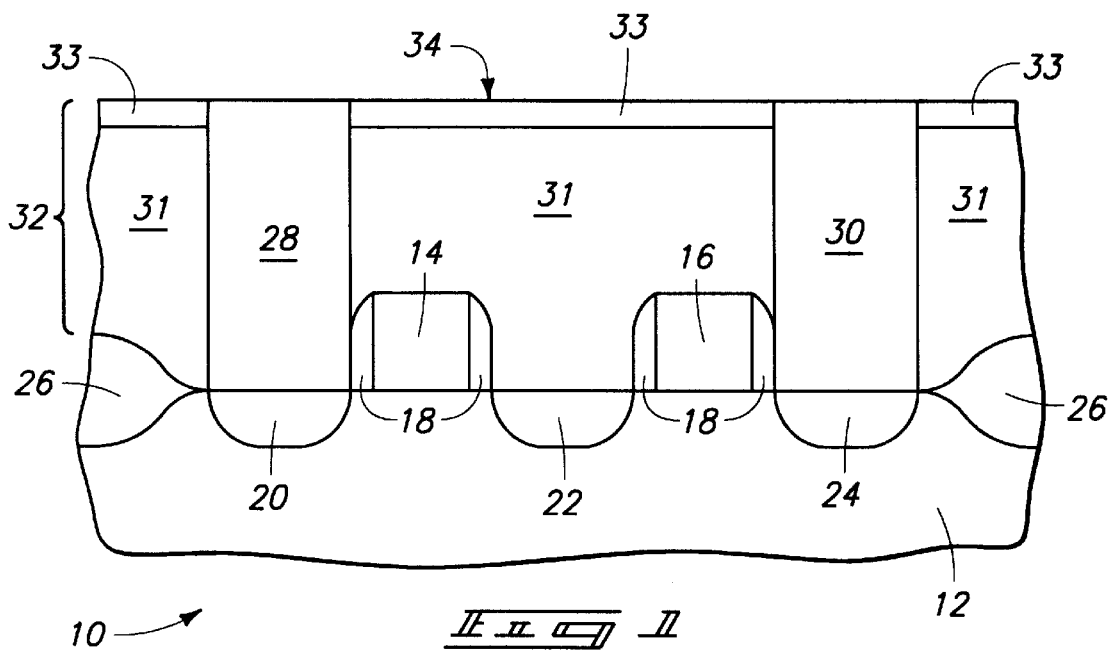
FIG. 1 is a diagrammatic, cross-sectional, fragmentary view of a semiconductor wafer fragment at a preliminary step of a process of the present invention.

Referring to FIG. 1, a semiconductor wafer fragment 10 is illustrated at a preliminary stage in the construction of a DRAM cell. Wafer fragment 10 comprises a substrate 12 having transistor gates 14 and 16 formed thereover. Transistor gates 14 and 16 can comprise conventional constructions, such as, for example, successive layers of gate oxide, polycrystalline silicon and metal silicide. Substrate 12 can comprise, for example, monocrystalline silicon. To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Insulative sidewall spacers 18 are formed over substrate 12 and adjacent transistor gates 14 and 16. Insulative spacers 18 can comprise conventional constructions, such as, for example, anisotropically-etched silicon nitride or silicon oxide.

Conductively doped diffusion regions 20, 22 and 24 are formed within substrate 12 and proximate transistor gates 14 and 16. Diffusion regions 20, 22 and 24 are node locations for ultimate connection to capacitor constructions and a bit line. Specifically, diffusion region 22 is connected to a bit line (not shown), and diffusion regions 20 and 24 are connected to conductively doped polysilicon plugs 28 and 30, respectively, which ultimately are connected to capacitor storage nodes (described in FIG. 5). Polysilicon plugs 28 and 30 extend through an insulative material 32, which can comprise, for example, a lower layer 31 of borophosphosilicate glass (BPSG) and an upper layer 33 of undoped silicon dioxide. Insulative material 32 can be formed by, for example, chemical vapor deposition over substrate 12. Polysilicon plugs 28 and 30 can be formed by, for example, forming contact openings within material 32, and subsequently filling such openings with polysilicon material deposited by, for example, chemical vapor deposition. In the shown embodiment, a planarized upper surface 34 is comprised by polysilicon plugs 28 and 30, and insulative material 32. Planarized upper surface 34 can be formed by, for example, chemical-mechanical polishing.

Field oxide regions 26 are formed over substrate 12 and can electrically isolate diffusion regions 20 and 24 from other circuitry (not shown) formed on substrate 12.

Figure 2:
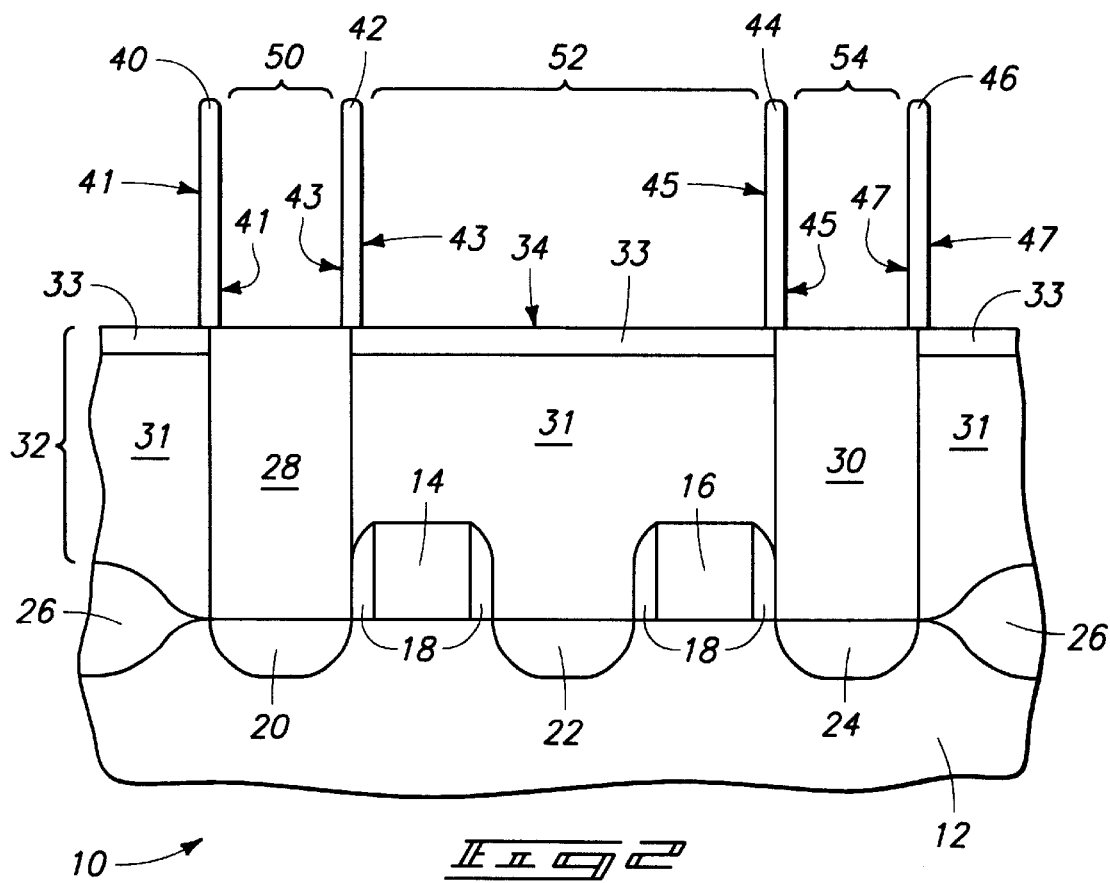
FIG. 2 is a view of the FIG. 1 wafer fragment shown at a processing step subsequent to that of FIG. 1.

Referring to FIG. 2, projections 40, 42, 44 and 46 are formed over planarized upper surface 34. Projections 40, 42, 44 and 46 can comprise, for example, conductively doped polysilicon and can be formed by, for example, chemical vapor deposition of polysilicon followed by photolithographic patterning. The projections preferably comprise silicon doped with phosphorus.

In the shown cross-sectional view, projections 40, 42, 44 and 46 comprise laterally opposing sidewalls 41, 43, 45 and 47, respectively. Projections 40 and 42 define a storage node location for a first capacitor construction, and projections 44 and 46 define a storage node location for a second capacitor construction. Projections 40, 42, 44 and 46 are separated by intervening regions 50, 52 and 54.

Figure 3:
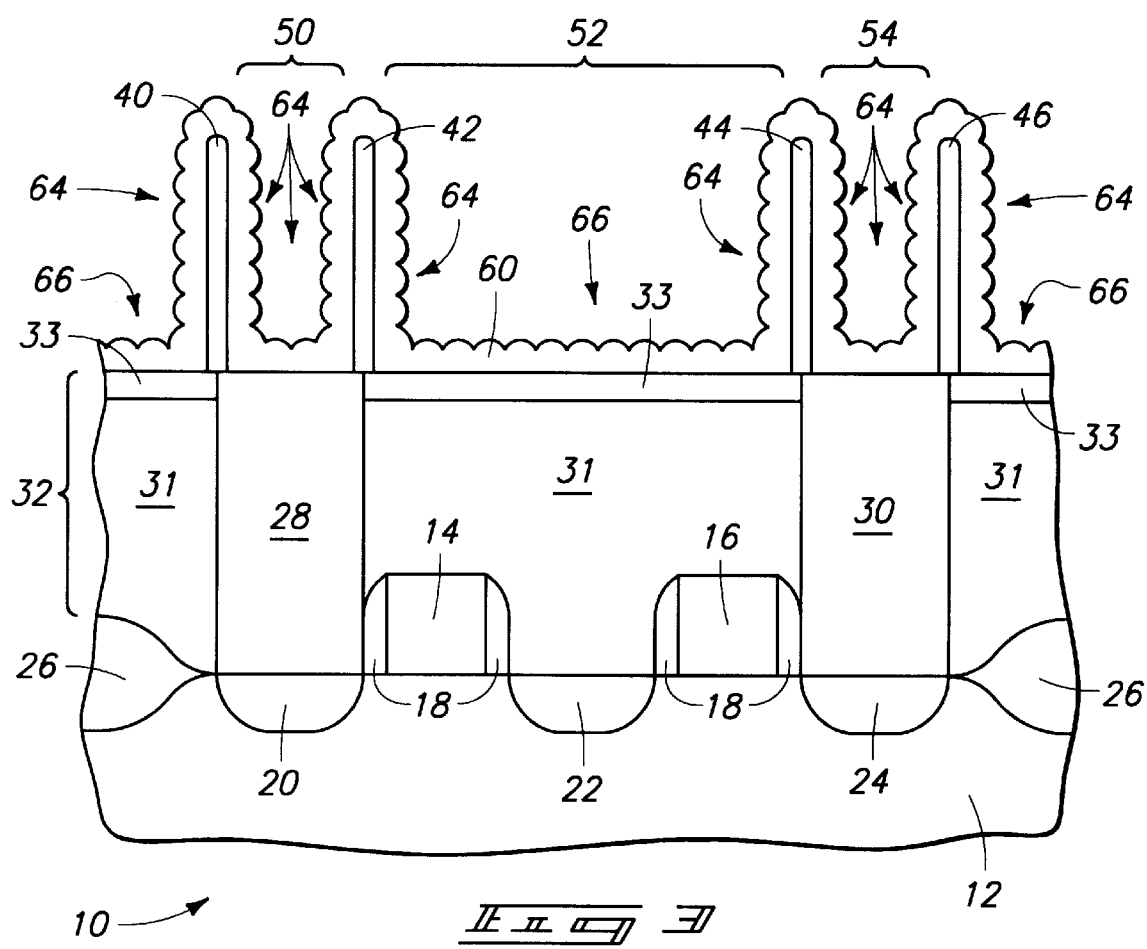
FIG. 3 is a view of the FIG. 1 wafer fragment shown at a processing step subsequent to that of FIG. 2.

Referring to FIG. 3, a silicon-comprising layer 60 is formed over projections 40, 42, 44 and 46, and over intervening regions 50, 52 and 54. In the exemplary shown embodiment, silicon-comprising layer 60 comprises roughened polysilicon (e.g., hemispherical grain polysilicon). Such roughened polysilicon can be formed by, for example, chemical vapor deposition. The roughened polysilicon is preferably formed to be initially less doped than projections 40, 42, 44 and 46, and can be, for example, initially formed as undoped silicon. After layer 60 is formed, wafer fragment 10 is preferably subjected to rapid thermal processing (RTP), such as an anneal at a temperature of from 900° C. to 1,000° C. for 15 seconds to diffuse dopant from the conductively doped polysilicon of projections 40, 42, 44 and 46 into portions of layer 60 proximate such projections. After the diffusion of dopant, silicon layer 60 is divided into two discrete types of material. The first type of material is a silicon-comprising mass 64 that is proximate projections 40, 42, 44 and 46, and which has received conductivity-enhancing dopant out-diffused from projections 40, 42, 44 and 46. The second type of material is a silicon-comprising mass 66 that is spaced from projections 40, 42, 44 and 46, and which has not received conductivity-enhancing dopant out-diffused from the projections. The out-diffusion of conductivity-enhancing dopant preferably increases a dopant concentration within regions 64 to at least 5% (by weight). In contrast, the concentration of dopant within regions 66 can be from about $1 \times 10^{16}$ atoms/cm$^3$ to about $1 \times 10^{17}$ atoms/cm$^3$, is preferably no greater than about $1 \times 10^{17}$ atoms/cm$^3$, can be less than about $1 \times 10^{16}$ atoms/cm$^3$, and can be about 0 atoms/cm$^3$.

It is noted that in the shown embodiment pillars 28 and 30 comprise conductively doped polysilicon, and that conductivity-enhancing dopant has out-diffused from pillars 28 and 30 upwardly into the overlying silicon-comprising layer 60 to form conductively doped silicon-comprising masses 64 extending entirely across regions 50 and 54. However, it is to be understood that the invention encompasses other embodiments (not shown) wherein conductivity-enhancing dopant does not diffuse upwardly from pillars 28 and 30. In such other embodiments, portions of silicon-comprising layer 60 within regions 50 and 54 will generally not comprise out-diffused conductivity-enhancing dopant.

Figure 4:
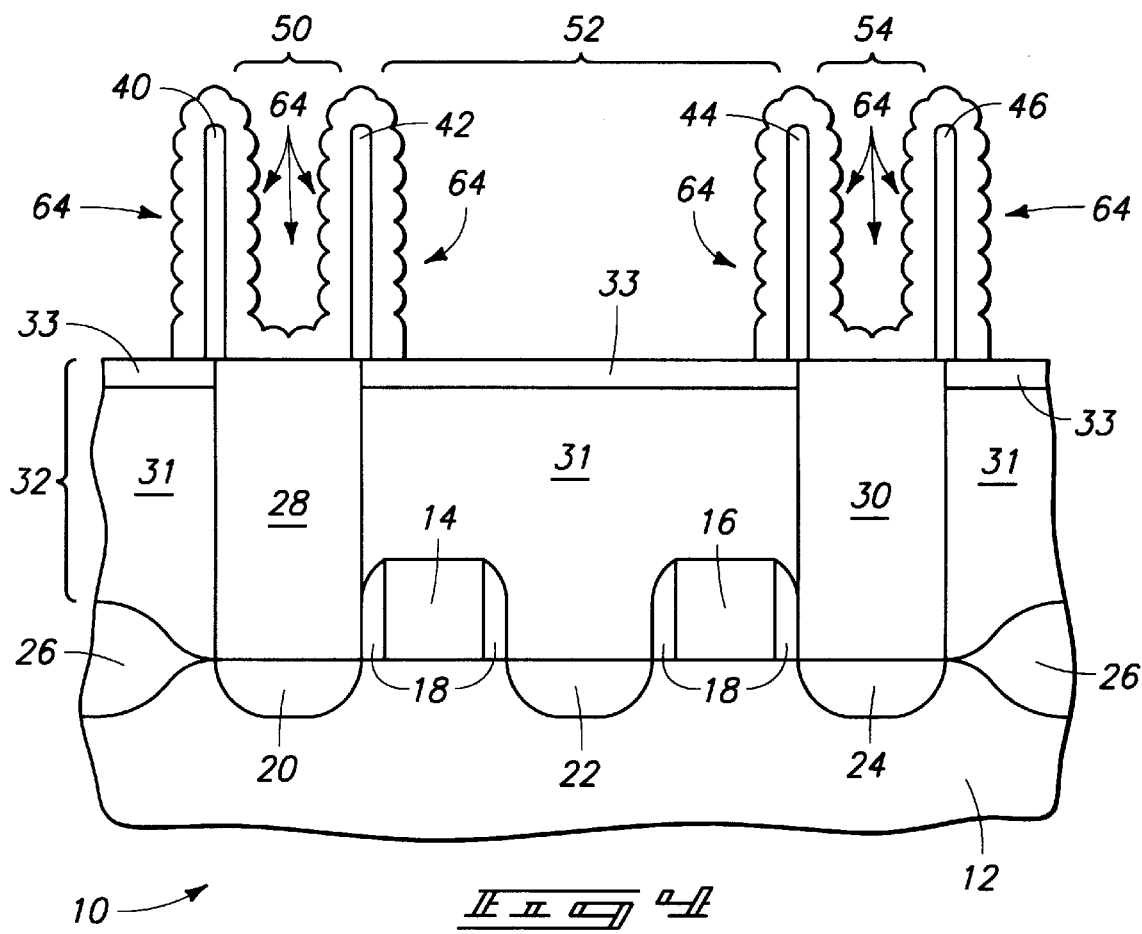
FIG. 4 is a view of the FIG. 1 wafer fragment shown at a processing step subsequent to that of FIG. 3.

Referring to FIG. 4, less doped silicon-comprising mass 66 (FIG. 3) is removed to leave the more doped silicon-comprising mass 64 remaining over projections 40, 42, 44 and 46. A method of selectively removing the less doped mass 66 relative to the more doped mass 64 is as follows. First, silicon layer 60 (FIG. 3) is exposed to an oxidizing agent. Such exposure can occur, for example, by exposing layer 60 to deionized water having an oxygen-comprising oxidizing agent dissolved therein. Suitable oxygen-comprising oxidizing agents include $O_2$, $O_3$ and $H_2O_2$. The oxidizing agent reacts with silicon-comprising layer 60 to form a layer of oxide (silicon dioxide) over silicon-comprising layer 60, with the layer of oxide generally being from about 5 Å to about 10 Å thick. The oxidizing agent reacts faster with doped silicon-comprising masses 64 than with undoped silicon-comprising masses 66, and accordingly forms a thicker layer of oxide over doped masses 64 than over undoped masses 66. In preferred embodiments, the reaction with the oxidizing agent is terminated before formation of any significant amount of oxide over undoped masses 66, with the term "significant amount of oxide" referring to an oxide layer that covers undoped masses 66 to a thickness greater than a monolayer of oxide (about 2.5 Å).

After the exposure to an oxidizing agent, layer 60 is exposed to one or more of TMAH, KOH, NaOH, and NH$_4$OH to selectively etch undoped masses 66 relative to doped masses 64. The selective etching occurs due to the protective oxide layer formed over doped masses 64. Specifically, the above-discussed etchants etch oxide much slower than silicon. Accordingly, undoped silicon-comprising masses 66 can be entirely removed before the etchant penetrates the protective oxide overlying doped silicon-comprising masses 64. An exemplary etch utilizes TMAH and hydrogen peroxide ($H_2O_2$) at a temperature of from about 40° C. to about 60° C. The TMAH and hydrogen peroxide solution can be formed as follows. First, a 2% TMAH solution is formed by combining 2.8 liters of 25 weight percent TMAH with 32.2 liters of deionized water. (The TMAH solution can be varied from 0.5% TMAH to 5% TMAH, by weight, but a 2% TMAH solution is found to be preferable.) A volume of 35 liters of the 2% (by weight) TMAH solution is then mixed with a volume of from 100 to 400 milliliters of an $H_2O_2$ solution (30% by weight) to form an etching solution of TMAH/$H_2O_2$.

The above-described processes of oxidation and etching effectively expose a doped silicon-comprising mass 64 and an undoped silicon-comprising mass 66 to common conditions which etch the undoped silicon-comprising mass 66 faster than the doped silicon-comprising mass 64.

It is noted that the above-described processing oxidizes doped silicon-comprising mass 64 in a separate discrete processing step from the etching of undoped silicon-comprising mass 66. It is to be understood, however, that the invention also encompasses embodiments in which the oxidizing and etching occur in a common treatment. In such embodiments, oxidants (such as, for example, $O_3$ or $H_2O_2$) can be provided in an etching solution such that oxidation of the doped silicon-containing masses occurs as silicon layer 60 is exposed to the etching solution. For instance, the $H_2O_2$ of the above-described TMAH solution can oxidize silicon-comprising masses 64 while the masses are exposed to the TMAH solution. The doped masses 64 can then etch more slowly than the undoped masses 66, which will have less oxide formed over them during exposure to the TMAH solution.

Figure 5:
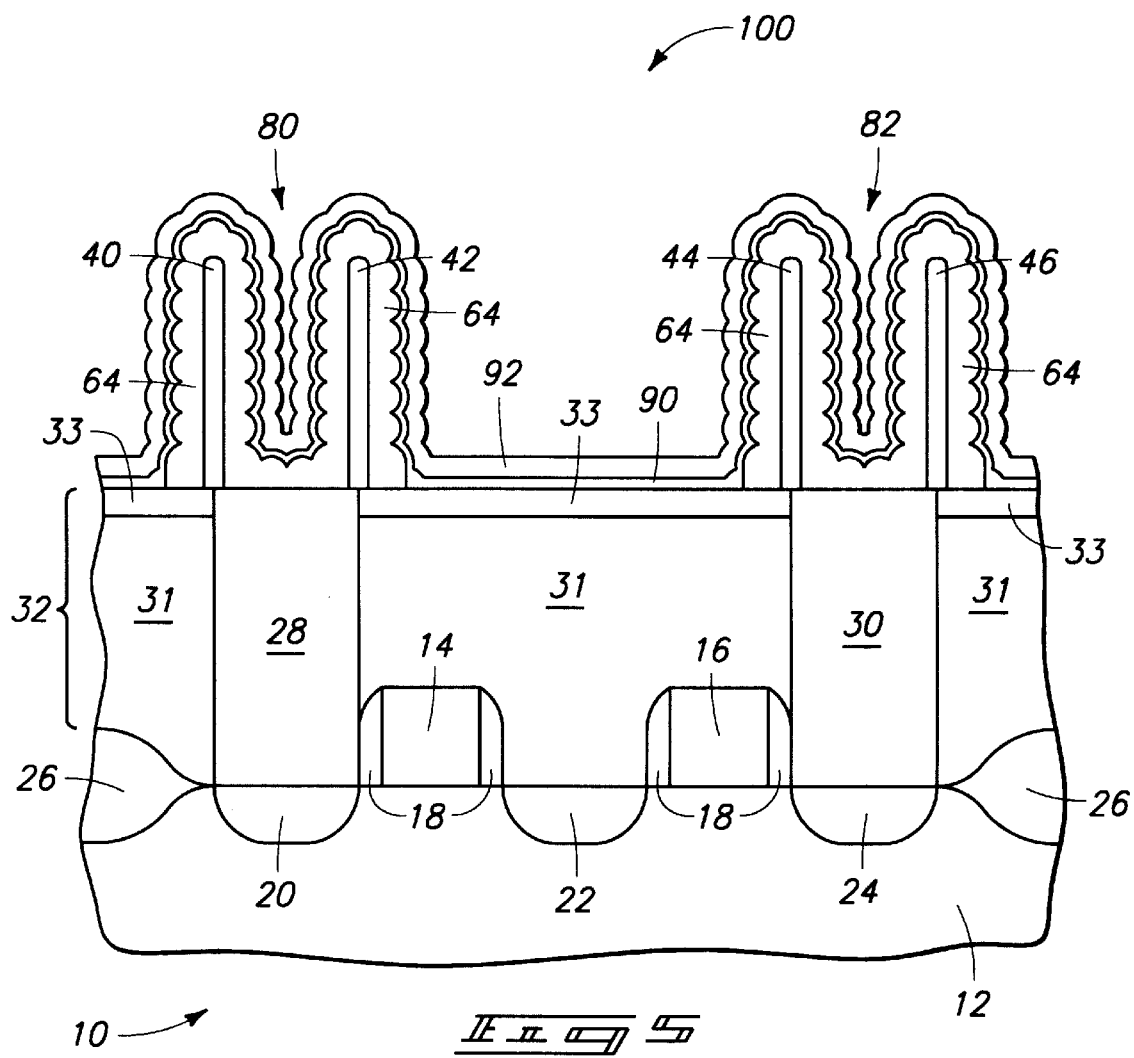
FIG. 5 is a view of the FIG. 1 wafer fragment shown at a processing step subsequent to that of FIG. 4.

Referring to FIG. 5, projections 40, 42, 44 and 46 are incorporated into capacitor constructions 80 and 82. Specifically, a dielectric layer 90 is formed over planar surface 34 (FIG. 2), and over the doped silicon-comprising masses 64 proximate projections 40, 42, 44 and 46. Dielectric layer 90 can comprise, for example, one or both of silicon dioxide and silicon nitride, and can be formed by, for example, chemical vapor deposition. A conductive layer 92 is then formed over layer 90. Conductive layer 92 can comprise, for example, conductively doped polysilicon, and can be formed by, for example, chemical vapor deposition.

Projections 40 and 42, together with conductively doped silicon-comprising masses 64 and pillar 28, form a storage node for first capacitor construction 80. Projections 44 and 46, together with conductively doped silicon-comprising masses 64 and pillar 30, form a storage node for second capacitor construction 82. Conductive layer 92 forms a second electrode for capacitor constructions 80 and 82, which is separated from the storage nodes by dielectric layer 90. Capacitor constructions 80 and 82, together with transistor gates 14 and 16 and the bit line (not shown) extending to node location 22 form a DRAM construction 100.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method comprising:
   providing two silicon-comprising masses, a first of the two masses comprising a first silicon material having a first dopant concentration; and a second of the two masses comprising a second silicon material having a lower dopant concentration than the first dopant concentration; and
   exposing the two masses to common oxidation conditions and subsequent common etch conditions to remove the material of the second mass selectively relative to the material of the first mass.

2. The method of claim 1 wherein the dopant in the first mass comprises phosphorus.

3. The method of claim 1 wherein the second mass comprises a dopant concentration of greater than 0 atoms/$cm^3$.

4. The method of claim 1 wherein the first mass comprises a dopant concentration of at least 5% (by weight).

5. The method of claim 1 wherein the first mass comprises a dopant concentration of at least 5% (by weight) and the second mass comprises a dopant concentration of from about $1\times10^{16}$ atoms/$cm^3$ to about $1\times10^{17}$ atoms/$cm^3$.

6. The method of claim 1 wherein the silicon-comprising masses comprise polysilicon.

7. The method of claim 1 wherein the silicon-comprising masses comprise roughened polysilicon.

8. The method of claim 1 wherein the silicon-comprising masses are comprised by a common layer.

9. A semiconductor processing method comprising:
   providing a silicon-comprising substrate having two silicon-comprising masses thereover, a first of the two masses comprising a higher dopant concentration than a second of the two masses;
   exposing the two masses to oxidizing conditions, the oxidizing conditions forming a thicker layer of oxide over the first mass than over the second mass; and
   exposing the two masses to common etching conditions, the thicker layer of oxide protecting the first mass during the exposure to the etching conditions, the second mass etching at a faster rate than the protected first mass under the etching conditions.

10. The method of claim 9 wherein the dopant in the mass comprises phosphorus.

11. The method of claim 9 wherein the second mass comprises a dopant concentration of greater than 0 atoms/$cm^3$.

12. The method of claim 9 wherein the first mass comprises a dopant concentration of at least 5% (by weight).

13. The method of claim 9 wherein the first mass comprises a dopant concentration of at least 5% (by weight) and the second mass comprises a dopant concentration of no greater than $1\times10^{17}$ atoms/$cm^3$.

14. The method of claim 9 wherein the first mass comprises a dopant concentration of at least 5% (by weight) and the second mass comprises a dopant concentration of from about $1\times10^{16}$ atoms/$cm^3$ to about $1\times10^{17}$ atoms/$cm^3$.

15. The method of claim 9 wherein the etching conditions comprise etching with one or more of TMAH, KOH, NaOH, and $NH_4OH$.

16. The method of claim 9 wherein the oxidizing conditions comprise exposing the first and second masses to one or more of $O_2$, $O_3$ and $H_2O_2$.

17. The method of claim 9 wherein the silicon-comprising masses comprise polysilicon.

18. The method of claim 9 wherein the silicon-comprising masses comprise roughened polysilicon.

19. A semiconductor processing method comprising:
   providing a silicon-comprising substrate having at least one doped polysilicon mass formed thereover and having regions spaced from the at least one doped polysilicon mass;
   forming roughened polysilicon along the at least one doped polysilicon mass and over said regions of the substrate;
   increasing a dopant concentration in the roughened polysilicon along the at least one doped polysilicon mass relative to any dopant concentration in the roughened polysilicon over said regions of the substrate;
   after increasing the dopant concentration, exposing the roughened polysilicon along the at least one doped polysilicon mass and the roughened polysilicon over said regions of the substrate to common conditions; and
   wherein said common conditions remove the roughened polysilicon over said regions of the substrate and leaves the roughened polysilicon along the doped polysilicon mass.

20. The method of claim 19 wherein:
   the substrate comprises an upper insulative layer;

the at least one doped polysilicon mass comprises an upwardly extending projection on the upper insulative layer; the upwardly extending projection in cross-sectional sideview comprising a pair of laterally opposing sidewalls;

the roughened polysilicon extending along both of the pair of laterally extending sidewalls; and the roughened polysilicon that is spaced from the at least one doped polysilicon mass being on the insulative layer.

21. The method of claim 20 wherein the at least one doped polysilicon mass comprises a pair of spaced upwardly extending projections on the upper insulative layer, the method further comprising:

electrically connecting the pair of spaced upwardly extending projections;

forming a dielectric layer extending along the roughened polysilicon that is along the spaced upwardly extending projections;

forming a conductive material separated from the roughened polysilicon along the spaced upwardly extending projections by the dielectric layer; the projections, dielectric layer and conductive material together comprising a capacitor construction.

22. The method of claim 21 wherein the forming the dielectric layer occurs after the exposing to the common etch.

23. The method of claim 19 wherein the increasing the dopant concentration comprises out-diffusing dopant from the doped polysilicon mass and into the roughened polysilicon along the doped polysilicon mass.

24. The method of claim 19 wherein the common conditions comprise etching with one or more of TMAH, KOH, NaOH, and $NH_4OH$.

25. The method of claim 19 wherein the dopant comprises phosphorus.

26. The method of claim 19 wherein the common conditions comprise etching with one or more of TMAH, KOH, NaOH, and $NH_4OH$, and further comprising exposing the roughened polysilicon to an oxidant before the etching.

27. A method of forming a plurality of capacitor constructions, comprising:

providing a monocrystalline silicon substrate having at least two projections formed thereover and having at least one region between the at least two projections that is spaced from the at least two projections, a first of the at least two projections defining a storage node location for a first a capacitor construction and a second of the at least two projections defining a storage node location for a second capacitor construction;

forming a layer of silicon along the at least two projections and over said at least one region of the substrate;

increasing a dopant concentration in the layer of silicon along the at least two projections relative to any dopant concentration in the layer of silicon over said at least one region of the substrate;

after increasing the dopant concentration, simultaneously exposing the layer of silicon along the at least two projections and the layer of silicon over said at least one region to common conditions, wherein said common conditions remove the layer of silicon from over said at least one region and leaves the layer of silicon along the two projections;

forming dielectric material adjacent the layer of silicon along the two projections; and forming a conductive material along the dielectric material; the conductive material being spaced from the layer of silicon along the two projections by the dielectric material; the conductive material, dielectric material and layer of silicon along the first projection comprising a first capacitor construction; and the conductive material, dielectric material and layer of silicon along the second projection comprising a second capacitor construction.

28. The method of claim 27 wherein at least two projections comprise at least four projections, a first pair of the four projections defining a storage node for the first capacitor and a second pair of the four projections defining a storage node for the second capacitor.

29. The method of claim 27 wherein the layer of silicon comprises roughened polysilicon.

30. The method of claim 27 wherein the dopant comprises phosphorus.

31. The method of claim 27 wherein the projections comprise conductively doped silicon, the layer of silicon formed along the projections and over the regions comprises roughened polysilicon; and the increasing a dopant concentration comprises out-diffusing dopant from the projections to the layer of silicon formed along the projections.

32. The method of claim 27 wherein the common conditions comprise etching with one or more of TMAH, KOH, NaOH, and $NH_4OH$.

33. The method of claim 27 wherein the common conditions comprise etching with one or more of TMAH, KOH, NaOH, and $NH_4OH$, and further comprising exposing the roughened polysilicon to an oxidant before the etching.

34. The method of claim 27 wherein the common conditions comprise etching with one or more of TMAH, KOH, NaOH, and $NH_4OH$, the method further comprising exposing the roughened polysilicon to an oxidant selected from the group consisting of one or more of $O_2$, $O_3$, and $H_2O_2$ before the etching.

* * * * *